(12) United States Patent
Smolen et al.

(10) Patent No.: US 8,716,876 B1
(45) Date of Patent: May 6, 2014

(54) SYSTEMS AND METHODS FOR STACKING A MEMORY CHIP ABOVE AN INTEGRATED CIRCUIT CHIP

(75) Inventors: Richard G. Smolen, Redwood City, CA (US); Jon M. Long, Livermore, CA (US)

(73) Assignee: Altera Corporation, San Jose, CA (US)

( * ) Notice: Subject to any disclaimer, the term of this patent is extended or adjusted under 35 U.S.C. 154(b) by 183 days.

(21) Appl. No.: 13/294,990

(22) Filed: Nov. 11, 2011

(51) Int. Cl.
*H01L 23/58* (2006.01)

(52) U.S. Cl.
USPC ............ 257/798; 257/E21.614; 257/E25.013; 438/109

(58) Field of Classification Search
USPC .................. 257/686, 798, E25.013, E21.614, 257/E27.614; 438/109
See application file for complete search history.

(56) References Cited

U.S. PATENT DOCUMENTS

| | | | |
|---|---|---|---|
| 6,157,213 A * | 12/2000 | Voogel | 326/41 |
| 6,337,579 B1 * | 1/2002 | Mochida | 326/41 |
| 6,917,219 B2 * | 7/2005 | New | 326/41 |
| 7,068,666 B2 | 6/2006 | Foster et al. | |
| 7,123,497 B2 * | 10/2006 | Matsui et al. | 365/51 |
| 7,152,136 B1 | 12/2006 | Charagulla | |
| 7,345,505 B2 | 3/2008 | Madurawe | |
| 7,402,897 B2 | 7/2008 | Leedy | |
| 7,521,785 B2 * | 4/2009 | Damberg et al. | 257/686 |
| 7,639,054 B1 * | 12/2009 | Burney | 327/161 |
| 7,701,252 B1 | 4/2010 | Chow et al. | |
| 7,888,185 B2 * | 2/2011 | Corisis et al. | 438/123 |
| 7,987,222 B1 * | 7/2011 | Hazanchuk et al. | 708/523 |
| 8,000,106 B1 | 8/2011 | Patel | |
| 8,294,252 B1 * | 10/2012 | Patel | 257/686 |
| 8,354,671 B1 * | 1/2013 | Im et al. | 257/48 |
| 8,384,428 B1 * | 2/2013 | Andrews et al. | 326/41 |
| 2002/0008309 A1 | 1/2002 | Akiyama | |
| 2002/0105096 A1 * | 8/2002 | Hirata et al. | 257/786 |
| 2004/0000705 A1 * | 1/2004 | Huppenthal et al. | 257/685 |
| 2004/0040005 A1 * | 2/2004 | Carison | 716/8 |
| 2004/0240301 A1 * | 12/2004 | Rao | 365/230.03 |
| 2005/0184399 A1 * | 8/2005 | Damberg et al. | 257/777 |
| 2007/0290316 A1 * | 12/2007 | Gibson et al. | 257/686 |
| 2008/0030226 A1 * | 2/2008 | Goodnow et al. | 326/38 |
| 2008/0230888 A1 * | 9/2008 | Sasaki | 257/686 |

(Continued)

FOREIGN PATENT DOCUMENTS

WO   WO2006/072142 A1   7/2006

OTHER PUBLICATIONS

U.S. Appl. No. 12/703,681, filed Feb. 10, 2010, entitled "Stacked Die Network-On-Chip for FPGS" by Francis Man-Chit Chow et al.

(Continued)

*Primary Examiner* — William F Kraig
*Assistant Examiner* — Joseph C Nicely
(74) *Attorney, Agent, or Firm* — Weaver Austin Villeneuve & Sampson LLP

(57) ABSTRACT

Systems and methods for stacking a memory chip with respect to an integrated circuit (IC) chip are described. In the systems and methods, a plurality of like memory chips are stacked above one or more IC chip members of a family. The use of a plurality of like memory chips for the family may save costs and complications involved in designing, fabricating, and assembling memory chips of different sizes. The use of a plurality of the memory chips on a single IC chip can enable higher data transfer rates due to parallel data transmission.

31 Claims, 9 Drawing Sheets

(56) References Cited

U.S. PATENT DOCUMENTS

| | | | |
|---|---|---|---|
| 2008/0307285 A1* | 12/2008 | Kim et al. | 714/752 |
| 2008/0309370 A1 | 12/2008 | Spangaro | |
| 2009/0051050 A1* | 2/2009 | Bakker et al. | 257/784 |
| 2009/0128188 A1* | 5/2009 | Madurawe | 326/39 |
| 2010/0148822 A1* | 6/2010 | Ozguz et al. | 326/101 |
| 2010/0169583 A1* | 7/2010 | Chung et al. | 711/149 |
| 2011/0044085 A1* | 2/2011 | Hinrichs | 365/63 |
| 2012/0074593 A1* | 3/2012 | Wu | 257/777 |
| 2012/0290902 A1* | 11/2012 | Radke | 714/786 |
| 2013/0058148 A1* | 3/2013 | Cantle et al. | 365/63 |

OTHER PUBLICATIONS

U.S. Appl. No. 12/775,363, filed May 6, 2010, entitled "Stacked Die Network-On-Chip for FPGA" by Francis Man-Chit Chow et al.

U.S. Appl. No. 11/897,916, filed Aug. 31, 2007, entitled "Die Partitioning and Leveraging" by Rakesh H. Patel.

Notice of Allowance dated Nov. 10, 2009 from U.S. Appl. No. 12/074,467.

Office Action dated May 19, 2009 from U.S. Appl. No. 12/074,467.

Office Action dated Nov. 30, 2011, U.S. Appl. No. 12/703,681.

Final Office Action dated May 17, 2012, U.S. Appl. No. 12/703,681.

Office Action dated Jan. 27, 2012, U.S. Appl. No. 12/775,363.

Office Action dated Jun. 1, 2012, U.S. Appl. No. 12/775,363.

K. Puttaswami, G. H. Loh: "Thermal Analysis of a 3D Die-Stacked High-Performance Microprocessor", GLVLSI, Apr. May 2006.

M. J. Alexander et al., "Three-Dimensional Field-Programmable Gate Arrays", in Proc. IEEE Intl. ASIC Conf., Austin, TX, Sep. 1995, pp. 253-256.

Xilinx Inc.: "Spartan 3-AN device", DS557, Sep. 24, 2007.

\* cited by examiner

SYSTEMS AND METHODS FOR STACKING A MEMORY CHIP ABOVE AN INTEGRATED CIRCUIT CHIP

FIELD OF THE INVENTION

The present disclosure generally relates to systems and methods for stacking a memory chip above an integrated circuit chip.

BACKGROUND

Die stacking is a process of mounting two or more chips on top of each other within a single semiconductor package. Die stacking, also known as chip stacking, significantly increases the amount of silicon chip area that can be housed within a single package of a given footprint. However, techniques for performing such chip stacking can be improved. Such chip stacking may not be performed in a cost-effective manner. For example, the chip stacking may be performed in a manner that may result in high manufacturing and assembly costs.

SUMMARY OF THE INVENTION

Devices, product families, systems, and methods for stacking memory chips with respect to integrated circuit (IC) chips are described. Implementations of the invention include one or more integrated circuit chips of the same device product family comprising a plurality of processing units or functional blocks, each of said integrated circuit chips having a top surface; and a plurality of like non-volatile memory dies mechanically and electrically attached to the top surface of at least one of said one or more ICs. The IC chips may, for example, be programmable logic devices (PLDs) or field programmable gate arrays (FPGAs), and the processing units or functional blocks may be logical elements (LEs). In some embodiments, more than one like non-volatile memory die may be attached to one or more IC chips of the same family. In other embodiments, at least one like non-volatile memory die may be attached to each of at least two IC chips of the same family while at least two of the like non-volatile memory dies are attached to at least one IC chip of the same family.

In other embodiments, the invention relates to a semiconductor device product family having a plurality of integrated circuit chips each of the chips having a process node in common, each of the integrated circuit chips having a top surface configured for mechanical and electrical attachment of one or more of like non-volatile memory die, and at least one of the integrated circuit chips having a surface configured for mechanical and electrical attachment of a plurality of the like non-volatile memory die.

In other embodiments, the invention relates to a semiconductor device product family having a plurality of integrated circuit chips each of the chips having a process node in common, and sub-pluralities of said plurality of integrated circuit chips, wherein each of the integrated circuit chips of one of said sub-pluralities has a top surface configured for mechanical and electrical attachment of one or more of like non-volatile memory die, and at least one of the integrated circuit chips having a surface configured for mechanical and electrical attachment of a plurality of the like non-volatile memory die.

In other embodiments, the invention relates to a method involving receiving an indication of an amount of memory required by one or more members of a product family of integrated circuit chips having a process node in common, wherein each of said integrated circuit chips has a top surface configured for mechanical and electrical attachment of one or more of a like non-volatile memory die, at least one of the integrated circuit chips having a surface configured for mechanical and electrical attachment of a plurality of the like non-volatile memory die. An amount of memory space to include in a non-volatile memory die to be attached to one or more of the integrated circuit chips of the product family is determined, and the non-volatile memory die is attached to one of the integrated circuit chips of the product family.

The use of a plurality of like memory chips across the members of a product family may save costs and complications involved in designing, fabricating, and assembling memory chips of different sizes, or in designing, fabricating and assembling IC chips configured for attachment to said memory chips. Further, the use of a plurality of the memory chips on a single IC chip can enable higher data transfer rates due to parallel data transmission.

A variety of designs of the memory chips, in which the memory chips have different memory capacities and physical dimensions, may be created. Moreover, a variety of fabrication methods may be used to fabricate the memory chips of different memory capacities and physical dimensions. Also, a variety of methods of assembly may be used to assemble the memory chips of different memory capacities and physical dimensions with respect to the IC chip members of the product family.

BRIEF DESCRIPTION OF THE DRAWINGS

The systems and methods for stacking a memory chip above an integrated circuit (IC) chip may best be understood by reference to the following description taken in conjunction with the accompanying drawings, which illustrate various embodiments of the present systems and methods. In the drawings, structural elements having the same or similar functions are denoted by like reference numerals.

DETAILED DESCRIPTION

The herein systems and methods for stacking a memory chip include stacking one or more like memory chips, that is, chips having the same memory capacity and physical dimensions, above integrated circuit (IC) chip members of a family. Such like memory chips or dies are also referred to herein as having the same size. A family of IC chip members can be defined as IC chips having a process node in common. In alternative embodiments, a family can also have a common architecture.

The use of like memory chips saves cost compared to stacking memory chips of different sizes above IC chip members of a same device product family. For example, use of memory chips of the same size can streamline the process of assembling the memory chips with respect to the IC chip members as manufacturing logistics are simplified. For example, an assembly machine (not shown) may be programmed to place multiple like memory chips on the IC chip members at corresponding x-y co-ordinates and wirebond the memory chips with the corresponding IC chip members. Like memory chip and the IC chip members may also be connected using flip chip techniques with solder bumps deposited onto the chips according to well-known procedures readily adaptable to this context by one of ordinary skill in the art given the description provided herein.

As another example, a lower amount of product design and manufacturing support may be required in fabricating memory chips of the same physical dimensions and memory capacity. These greater efficiencies can allow for achieving larger die volumes of the IC chips with attached memory devices in production.

Further, docking and logic control configurations associated with attaching memory dies to IC chip members of a same product family can be simplified by using memory chips having the same physical dimensions and memory capacity.

The systems and methods described herein may also allow the memory chips of the same size to be fabricated by using a trailing edge process. These memory chips may be used with the IC chip members that are fabricated by using a leading edge process.

Additionally, the use of like memory chips across a product family or a portion of a product family can provide data transfer rate benefits. For example, use of like memory chips for attaching to each of, or a subset of, the IC chip members of a product family can lead to more than one memory chip being attached to certain members of the product family, for example, family members having larger memory requirements. This can enable higher data transfer rates because die stacking of multiple memory chips on a single IC chip can allow for transfer of parallel bit streams from each memory chip to and from the IC chip, and can thus provide higher overall data transfer speeds relative to a data transfer between an IC chip and a single memory chip.

Figure 1:
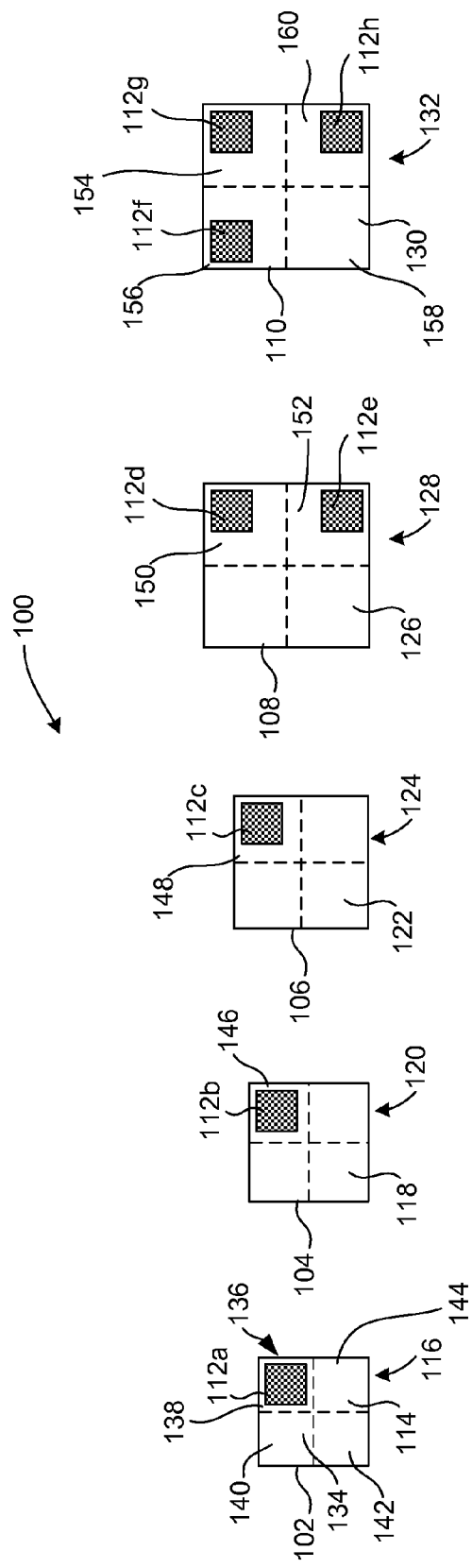
FIG. 1 is a top view of exemplary memory chips stacked above IC chip members of a first family, in accordance with one embodiment of the present invention.

FIG. 1 is a top view of exemplary multiple stacks 100. The stacks 100 include memory chips 112 stacked above a first IC chip member 102, a second IC chip member 104, a third IC chip member 106, a fourth IC chip member 108, and a fifth IC chip member 110. Any of memory chips may include a nonvolatile memory, such as a read-only memory (ROM), an erasable programmable ROM (EPROM), an electrically erasable programmable ROM (EEPROM), a Flash memory, a magnetic random access memory (MRAM), a ferroelectric RAM, or a phase change memory (PCME).

Like memory chips 112 have the same memory capacity and physical dimensions. For example, memory chip 112a may have a same amount of memory space as any other memory chip 112b, 112c, 112d, 112e, 112f, 112g, or 112h. The memory space that may be measured in terms of a number of data bits that may be stored in the memory chip 112a. As another example, memory chip 112a may be a copy of another memory chip 112b, 112c, 112d, 112e, 112f, 112g, or 112h. As yet another example, memory chip 112a can store at most x gigabyte (GB) of data and another memory chip 112b, 112c, 112d, 112e, 112f, 112g, or 112h can store at most x GB of data, where x is an integer.

Note, in some embodiments of the invention, first through fifth IC chip members 102, 104, 106, 108, and 110 may include an IC chip, such as a programmable logic device (PLD), which may be programmed in the field. Memory chips attached to such programmable logic devices can be particularly useful as they may store configuration data used to configure elements of the programmable logic devices. In such systems, the data bits in question can be configuration bits. However, it is noted the invention is not limited to such embodiments.

Additionally, first through fifth IC chip members 102, 104, 106, 108, and 110 may belong to a same first family. As noted above, a family of IC chip members may be defined as IC chips having a process node in common. Alternatively, such IC chips may also have a common architecture. An IC chip member of a family may have a different capacity for processing data than any of the other IC chip members of the family. For example, first IC chip member 102 may have a first number of processing units or functional blocks, second IC chip member 104 may have an increased number of processing units or functional blocks compared to the first family member, third IC chip member 106 may have a comparatively greater amount, and fourth IC chip member 108 and fifth IC chip members 110 may have even more.

Particular examples of a family of IC chip members that would benefit from this process may be a Cyclone® family available from Altera® Corporation, a Cyclone II family available from Altera Corporation, a Cyclone IV family available from Altera Corporation, a Cyclone V family available from Altera Corporation, an Arria® family available from Altera Corporation, or an Arria II family available from Altera Corporation.

Continuing with the example of a family of IC chips and assuming that the IC chip members constitute a programmable logic device family, IC chip members 102, 104, 106, 108, and 110 of the first family may have a range of number of Logic Elements (LEs) different than a range of number of LEs of IC chip members in a second family of IC chip members. For example, first IC chip member 102 may include 2 k LEs, second IC chip member 104 may include 4 k LEs, third IC chip member 106 may include 8 k LEs, fourth IC chip member 108 may include 14 k LEs, and fifth IC chip member 110 may include 20 k LEs, when the first through fifth IC chip members belong to the first family. In this example, a range of LEs of IC chip members 102, 104, 106, 108, and 110 of the first family extends from 2 k to 20 k. Moreover, in this example, the first IC chip member 102 may be a smallest member of the first family having the lowest number of LEs and the fifth IC chip member 110 may be a largest member of the first family having the highest number of LEs. The second family may include IC chip members having LEs that range from 5 k to 30 k. It is appreciated that a smallest IC chip member of the second family may have a higher number of LEs than the smallest IC chip member 102 of the first family. Moreover, it is also appreciated that a largest IC chip member of the second family may have a higher number of LEs than the largest IC chip member 110 of the first family. In some embodiments, the second family may include a different number of IC chip members than that within the first family. For example, the first family may include 5° C. chip members and the second family may include 7° C. chip members.

Fifth IC chip member 110 may include more LEs than fourth IC chip member 108. Moreover, fourth IC chip member 108 may include more LEs than third IC chip member 106, third IC chip member 106 may include more LEs than second IC chip member 104, and second IC chip member 104 may include more LEs than first IC chip member 102.

As noted above, each IC chip member 102, 104, 106, 108, and 110 may include an IC chip, such as, a programmable logic device (PLD), or Application Specific Integrated Circuit (ASIC). While the description thus far has focused on how many Logic Elements (LEs) an IC chip may have, any determination of how much memory an IC chip requires may be used. Further, the IC chip may have other types of functional blocks or processing units instead of LEs.

Moreover, each IC chip member 102, 104, 106, 108, and 110 may have a front side and a back side. For example, the first IC chip member 102 may have a first IC chip front side 114 and a first IC chip back side 116 (not visible in FIG. 1), the second IC chip member 104 may have a second IC chip front side 118 and a second IC chip back side 120 (not visible in FIG. 1). As another example, third IC chip member 106 may have a third IC chip front side 122 and a third IC chip back side 124 (not visible in FIG. 1), the fourth IC chip member 108 may have a fourth IC chip front side 126 and a fourth IC chip back side 128 (not visible in FIG. 1), and the fifth IC chip member 110 may have a fifth IC chip front side 130 and a fifth IC chip back side 132 (not visible in FIG. 1).

Further, each memory chip 112a, 112b, 112c, 112d, 112e, 112f, 112g, or 112h may have a memory chip front side 134 and a memory chip back side 136 (not visible in FIG. 1). One or more memory elements, such as RAM cells or registers, may be integrated within the memory chip front side 134.

Memory chips 112 may be stacked above first IC chip member 102, second IC chip member 104, and third IC chip member 106 so that memory chip front side 134 and front sides 114, 118, and 122 face a same direction. Moreover, memory chips 112 are stacked above fourth IC chip member 108 so that memory chip front side 134 and fourth IC chip front side 126 face a same direction. Furthermore, three memory chips 112 are stacked above fifth IC chip member 110 so that memory chip front side 134 and fifth IC chip front side 130 face a same direction.

The front side of an IC chip member can be split into four quadrants. For example, first IC chip front side 114 may be split into a first IC chip top right quadrant 138, a first IC chip top left quadrant 140, a first IC chip bottom left quadrant 142, and a first IC chip bottom right quadrant 144. As another example, second IC chip front side 118 may be split into four quadrants including a second IC chip top right quadrant 146 and a second IC chip member 104 bottom right quadrant. As yet another example, third IC chip front side 122 may be split into four quadrants including a third IC chip top right quadrant 148. As still another example, fourth IC chip front side 126 may be split into four quadrants including a fourth IC chip top right quadrant 150 and a fourth IC chip bottom right quadrant 152. As another example, fifth IC chip front side 130 may be split into four quadrants including a fifth IC chip top right quadrant 154, a fifth IC chip top left quadrant 156, a fifth IC chip bottom left quadrant 158, and a fifth IC chip bottom right quadrant 160.

Memory chip 112a may be stacked above first IC chip top right quadrant 138. For example, a top view of a stack including first IC chip member 102 and memory chip 112a stacked above the first IC chip member 102 shows memory chip 112a located within first IC chip top right quadrant 138. Similarly, memory chip 112b may be stacked above second IC chip top right quadrant 146 and memory chip 112c may be stacked above third IC chip top right quadrant 148. Moreover, memory chip 112d may be stacked above fourth IC chip top right quadrant 150 and memory chip 112e may be stacked above fourth IC chip bottom right quadrant 152. Furthermore, memory chip 112g may be stacked above fifth IC chip top right quadrant 154, memory chip 112h may be stacked above fifth IC chip bottom right quadrant 160, and memory chip 112f may be stacked above fifth IC chip top left quadrant 156.

In one embodiment, memory chip 112a that may be stacked above first IC chip member 102 may store configuration data used to configure memory elements of first IC chip member 102. Moreover, memory chip 112b that may be stacked above second IC chip member 104 may store configuration data used to configure memory elements of second IC chip member 104. Furthermore, memory chip 112c that may be stacked above third IC chip member 106 may store configuration data used to configure memory elements of third IC chip member 106.

Moreover, memory chip 112d may store configuration data used to configure a portion of fourth IC chip member 108 and memory chip 112e may store the remaining of configuration data used to configure the remaining portion of fourth IC chip member 108. For example, memory chip 112d may store configuration data used to configure half of LEs of fourth IC chip member 108 and memory chip 112e may store the remaining of configuration data used to configure the remaining LEs of fourth IC chip member 108.

Similarly, memory chip 112f may store configuration data used to configure a first portion of fifth IC chip member 110, memory chip 112g may store the configuration data used to configure a second portion of fifth IC chip member 110, and memory chip 112g may store configuration data used to configure the remaining portion of fifth IC chip member 110. For example, memory chip 112f may store configuration data used to configure one-third of LEs of fifth IC chip member 110, memory chip 112g may store the configuration data used to configure another one-third LEs of fifth IC chip member 110, and memory chip 112h may store configuration data used to configure the remaining LEs of fifth IC chip member 110.

In various embodiments, any number of memory chips 112 may be stacked above an IC chip member. For example, a memory chip (not shown) may be stacked above fifth IC chip bottom left quadrant 158 in addition to the three memory chips 112f, 112g, and 112h. The memory chip may be the same as any of memory chips 112. Additionally, in various embodiments, any number of memory chips 112 may be used for general purpose memory, or for a specified purpose associated with the IC chip it is stacked above.

In some embodiments, a portion of any of memory chips 112 may be located above any number of quadrants of an IC chip. For example, a first portion of memory chip 112a may be located above first IC chip top left quadrant 140, a second portion of the memory chip 112a may be stacked above first IC chip top right quadrant 138, a third portion of the memory chip 112a may be stacked above first IC chip bottom left quadrant 142, and a fourth portion of the memory chip 112a may be stacked above first IC chip bottom right quadrant 144. As another example, memory chip 112b may be stacked above second IC chip member 104 so that a top view of the stack shows that memory chip 112b may be centered within second IC chip member 104.

In one embodiment, memory chips 112 may exclude a volatile memory. In various embodiments, the first family may include any number of IC chip members. In some embodiments, the IC chip members 102, 104, 106, 108, and 110 may be the only members of the first family.

Figure 2:
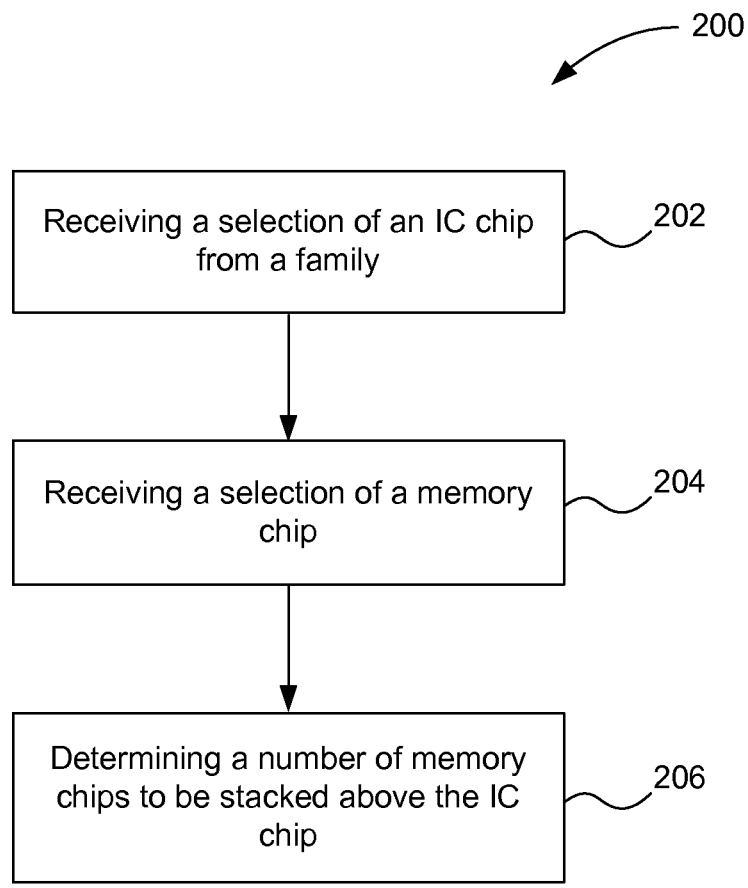
FIG. 2 is an exemplary method for determining a number of memory chips to be stacked above each IC chip member of a family, in accordance with one embodiment of the present invention.

FIG. 2 is an exemplary method 200 for determining a number of memory chips 112 for each IC chip member of a family. A processing unit, described below, may execute method 200. The processing unit may comprise one or more computing devices.

The determination of a number of memory chips 112 for each IC chip member of a family could be made at a design stage where an IC chip or a memory chip is being designed, or at a packaging or manufacturing stage where a memory chip is being attached to an IC chip, for example.

In an embodiment involving programmable logic devices, for example, a determination of a number of memory chips 112 for each IC chip member of a family could be based on a calculation of how many memory dies of a determined like memory capacity need to be attached to an IC logic chip with a known number of LEs in order to provide sufficient data (e.g., configuration data) for the number of LEs. In some embodiments, determining a number of memory chips 112 for each IC chip member of a family may also involve determining optimal configurations of IC chip and memory die combinations.

Steps that might be involved in making a determination of a number of memory chips 112 for each IC chip member of a family are shown in FIG. 2 and described below.

In operation 202, a selection of an IC chip member from a family of IC chip members may be received from the user via an input device, which is described below. For example, the processing unit, may receive a selection of a largest IC chip member in a family of IC chip members from the user. As noted above, a processing unit may comprise one or more computing devices. As another example, a medium-sized IC chip member of a family of IC chip members may be received. The medium-sized IC chip member of the family has a number of LEs lower than some of the remaining members of the family and higher than some other of the remaining members of the family. If the medium-sized IC chip is a member of a family having an odd number of IC chip members, the medium-sized IC chip member may be a middle member. The middle member may have a number of LEs greater than half of the remaining members of the family and the less than the other half of the remaining members. If the medium-sized IC chip is a member of the family with an even number of IC chip members, the medium-sized IC chip may be a middle member and the middle member may have a number of LEs less than half of the IC chip members of the family and greater than the remaining members of the family. As yet another example, the processing unit may receive a smallest IC chip member of a family of IC chip members. In some embodiments, the user may provide a number of LEs within an IC chip member via the input device to provide a selection of an IC chip member to the processing unit. The selection of the IC chip member may be used to determine a number of memory chips 112 to stack above the IC chip member.

In operation 204, a selection of memory chip 112a, 112b, 112c, 112d, 112e, 112f, 112g, or 112h from the user via the input device may be received. In various embodiments, the user may provide a number of LEs that may be configured by configuration data stored in a memory space of the single memory chip 112a, 112b, 112c, 112d, 112e, 112f, 112g, or 112h to provide a selection of the memory chip. In various other embodiments, the user may provide a different criteria for memory requirements to aid in the selection of the memory chip.

As noted above, use of like memory chips for attaching to each of the IC chip members of a product family can lead to more than one memory chip being required for members of the product family having larger memory requirements. In operation 206, a number of memory chips 112 to be stacked above the IC chip member selected at operation 202 may be determined. The number may be determined based on a memory capacity of the memory chip 112a, 112b, 112c, 112d, 112e, 112f, 112g, or 112h that is selected at operation 204 and on a memory size of the IC chip member selected at operation 202. For example, a selection of fifth IC chip member 110 that has 20 k LEs may be received. Moreover, a selection of the memory chip 112a, 112b, 112c, 112d, 112e, 112f, 112g, or 112h that has a memory capacity to store configuration data to configure 8 k LEs may be received. In this example, it may be determined that three memory chips 112f, 112g, and 112h may be stacked above fifth IC chip member 110. As another example, a selection of fourth IC chip member 108 that has 14 k LEs may be received. Furthermore, a selection of memory chip 112a, 112b, 112c, 112d, 112e, 112f, 112g, or 112h that has a memory capacity to store configuration data to configure 8 k LEs may be received. In this example, it may be determined that two memory chips 112d and 112e may be stacked above fourth IC chip member 108. As yet another example, a selection of the first IC chip member 102 that has 2 k LEs may be received. Also, a selection of memory chip 112a that has a memory capacity to store configuration data to configure 8 k LEs may be received. In this example, it may be determined that one memory chip 112a may be stacked above first IC chip member 102.

It is noted that although the flowchart illustrated in FIG. 2 shows an order of execution of the operations 202, 204, and 206, in various embodiments, the operations may be executed in an order different than the one illustrated.

In alternative embodiments, the members of the family can be divided into subsets, and each sub-family can have its own particular like memory die. In such embodiments, the family members can be grouped into two or more subsets, each sub-family using a different like memory die to meet the memory requirements of the IC chips of that sub-family.

As noted above, FIG. 2 shows an exemplary method 200 for determining a number of memory chips 112 for each IC chip member of a family. For embodiments where the members of the family are divided into subsets, and each sub-family has its own particular like memory die, FIG. 2 may also describe an exemplary method 200 for determining a number of memory chips 112 for each IC chip member of a sub-family of the original family.

Figure 3A:
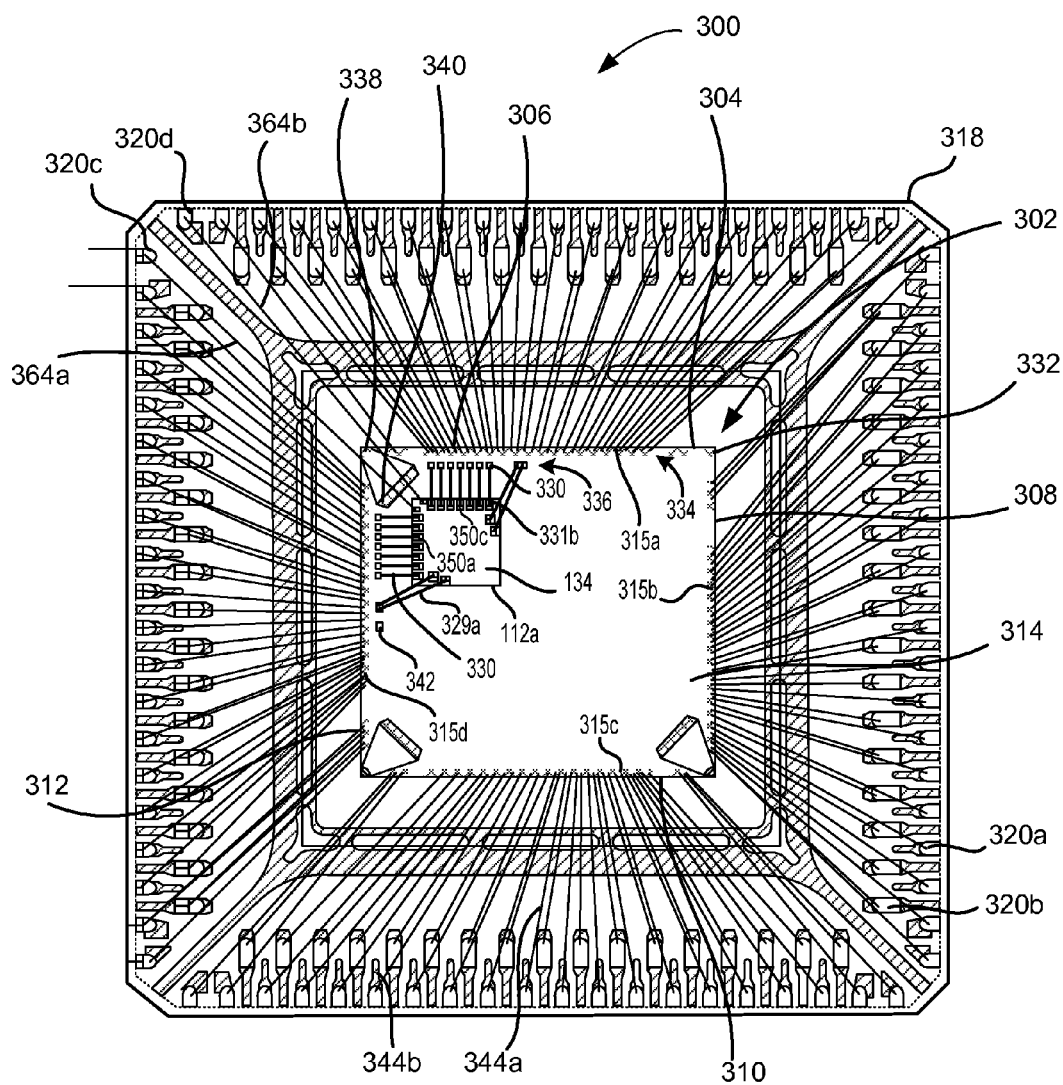
FIG. 3A is a top view of an exemplary package including a stack, in accordance with one embodiment of the present invention.
Figure 3B:
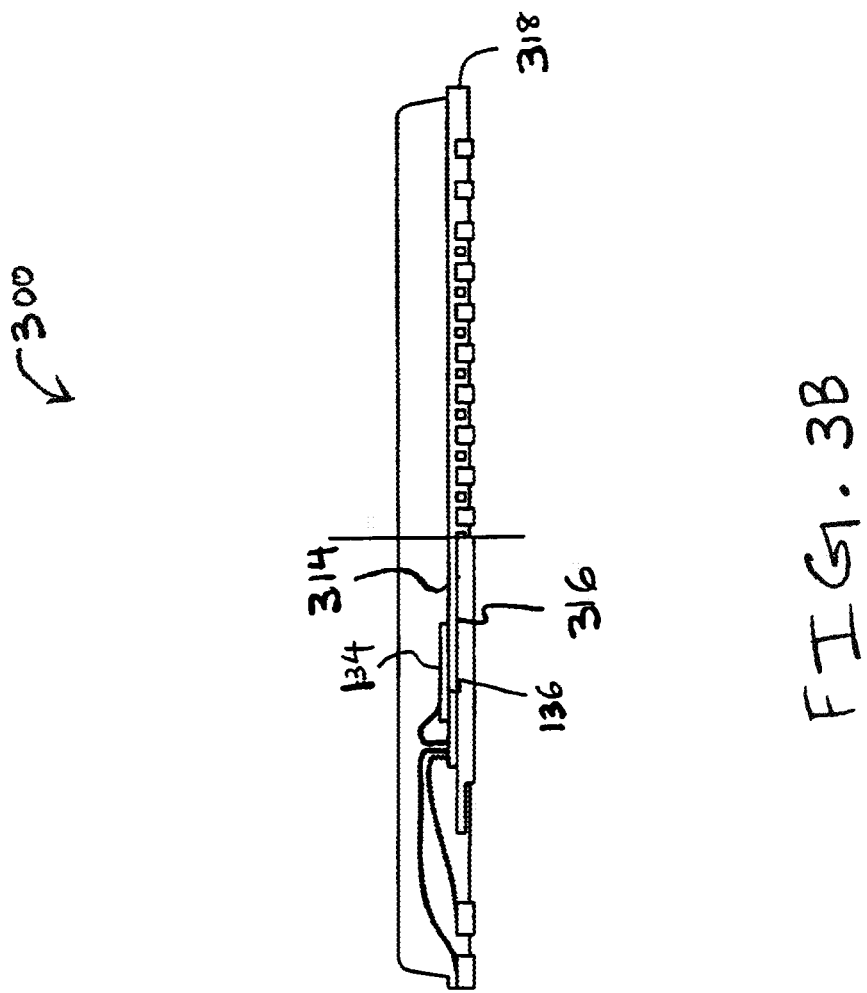
FIG. 3B is a front view of an exemplary package, in accordance with one embodiment of the present invention.
Figure 3C:
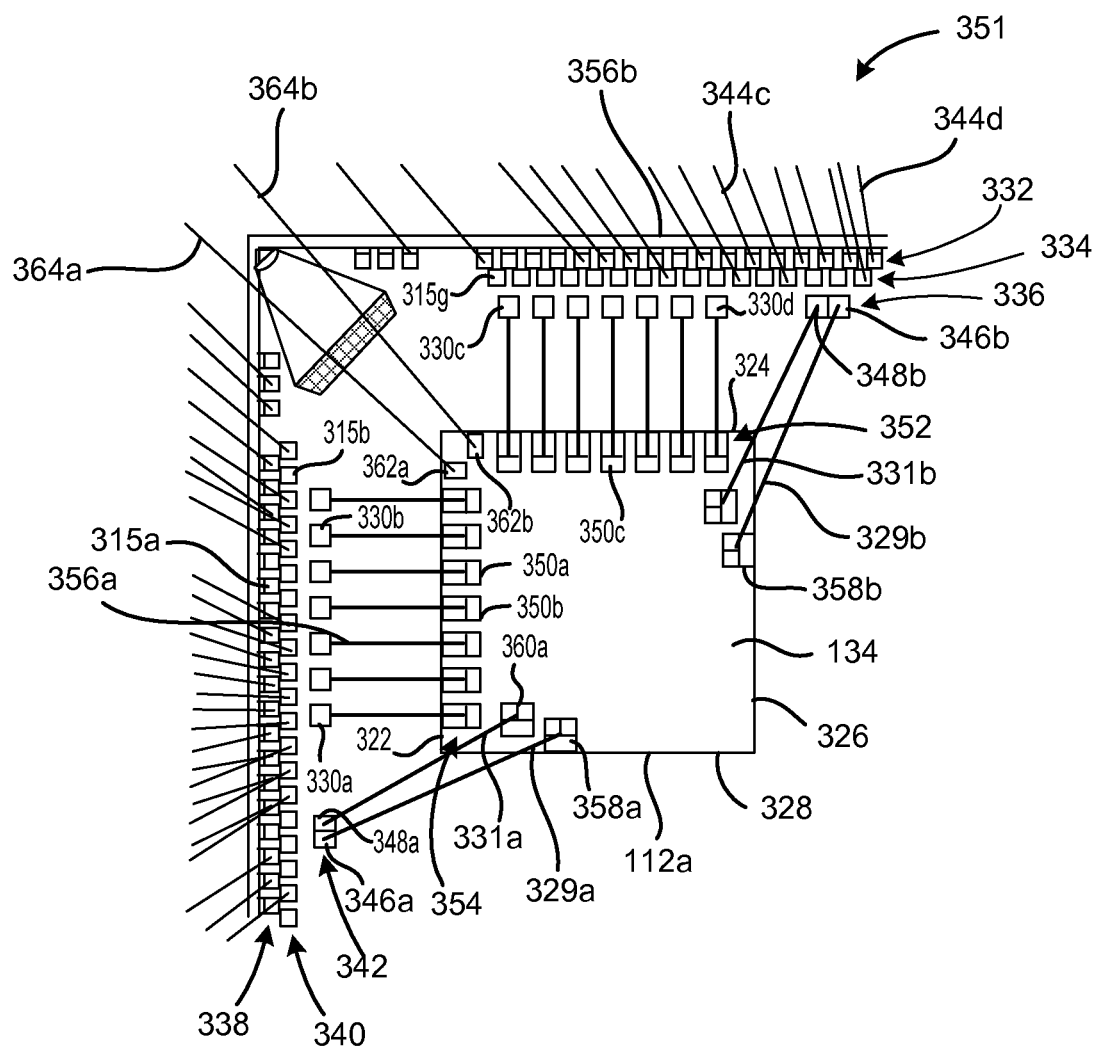
FIG. 3C is a top view of an exemplary portion of a stack, in accordance with one embodiment of the present invention.

With reference to FIG. 3, a package 300 including a stack 302 is described. Stack 302 may include memory chip 112a and an IC chip 304. A portion 351 of stack 302 is shown in detail in FIG. 3C. IC chip 304 is an example of first IC chip member 102, second IC chip member 104, third IC chip member 106, fourth IC chip member 108, or fifth IC chip member 110. IC chip 304 has an IC chip top edge 306, an IC chip right edge 308, an IC chip bottom edge 310, and an IC chip left edge 312. IC chip 304 has an IC chip front side 314 and an IC chip back side 316, shown in FIG. 3B. Package 300 may further include a substrate 318, shown in FIG. 3B. Substrate 318 may have multiple input/output (IO) substrate pads 320 located along a periphery of substrate 318. In FIG. 3C, the memory chip 112a may include a memory chip left edge 322, a memory chip top edge 324, a memory chip right edge 326, and a memory chip bottom edge 328.

Moreover, in FIG. 3C, IC chip 304 may have multiple IO IC pads 330 that may be arranged adjacent to a first row 332 of IO pads 315 and a second row 334 of IO pads 315. First row 332 may be located adjacent to IC chip top edge 306 and second row 334 may be located adjacent to the first row 332. IO IC pads 330 may be located on IC chip front side 314 in a third row 336 of IC chip 304. Third row 336 may be adjacent to second row 334.

Similarly, as shown in FIG. 3C, IC chip 304 has multiple IO IC pads 330 that may be arranged adjacent to a first column 338 of IO pads 315 and a second column 340 of IO pads 315. First column 338 may be located adjacent to IC chip left edge 312 and second column 340 may be located adjacent to the first column 338. IO IC pads 330 may be located on IC chip front side 314 in a third column 342 of IC chip 304. Third column 342 may be adjacent to second column 340.

Referring back to FIG. 3B, IC chip 304 may be stacked above substrate 318. For example, IC chip back side 316 may be placed above substrate 318. IC chip back side 316 may include a substrate of IC chip 304. Moreover, IC chip back side 316 may be attached with substrate 318 via an attach material, such as an epoxy.

Moreover, memory chip back side 136 may be stacked adjacent to and above IC chip front side 314. For example, memory chip back side 136 may be attached via the attach material to IC chip front side 314. Memory chip back side 136 may include a portion of a substrate of memory chip 112a.

As shown in FIG. 3A, IO substrate pads 320 may be coupled with IO pads 315 via multiple substrate connections 344, which may be conductors, such as wires. IO IC pads 330 may be ball bond pads or stitch pads.

Furthermore, in FIG. 3C, IC chip 304 may include multiple IC chip power pads 346 on IC chip front side 314 and multiple IC chip ground pads 348 on IC chip front side 314. For example, IC chip power pad 346a and IC chip ground pad 348a may be located in the third column 342 and another IC chip power pad 346b and another IC chip ground pad 348b may be located in the third row 336. An of IC chip power pads 346 may be a ball bond pad or a stitch pad. Moreover, any of IC chip ground pads 348 may be a ball bond pad or a stitch pad. A minimum amount of surface area, such as from 1 percent to 2 percent, of IC chip 304 may be used by placing IO IC pads 330, power pads 346, and ground pads 348 on the IC chip 304.

Moreover, memory chip 112a may include multiple IO memory pads 350 located in a memory chip first row 352 on memory chip front side 134. For example, memory chip 112a includes multiple IO memory pads 350 located in a memory chip first column 354 on memory chip front side 134. Each IO memory pad 350a, b, c, d, e, f, or g may be a ball bond pad or a stitch pad. Moreover, memory chip first row 352 may be adjacent to third row 336 and memory chip first column 354 may be adjacent to third column 342. Moreover, memory chip first column 354 may be located adjacent to memory chip left edge 322 and memory chip first row 352 may be located adjacent to memory chip top edge 324.

IO IC pads 330 of third row 336 may be coupled to IO memory pads 350 of memory chip first row 352 via multiple IC connections 356, which may be conductors. Each IC connection 356a or 356b may have a same length. For example, a resistance and inductance of all IC connections 356 is the same. The same length may help achieve a low cost, such as manufacturing and/or assembly cost, associated with IC connections 356.

Moreover, memory chip 112a may include multiple memory chip power pads 358 on memory chip front side 134 and multiple memory chip ground pads 360 on memory chip front side 134. Memory chip power pad 358a and ground pad 360a are located adjacent memory chip bottom edge 328. Moreover, memory chip power pad 358b and ground pad 360b are located adjacent to memory chip right edge 326.

Memory chip power pads 358 may be coupled to IC chip power pads 346 via power connections 329, which may be conductors. Moreover, memory chip ground pads 360 may be coupled to IC chip ground pads 348 via ground connections 331, which may be conductors.

Stacking of memory chip 112a above a quadrant of IC chip 304 prevents any angling in IC connections 356, power connections 329, and/or ground connections 331. For example, all IC connections 356 may be straight and do not include any angles. It is noted that using IC connections 356 of a same length, using power connections 329 of a same length, using ground connections 331 of a same length, and/or using external connections 364 of a same length may streamline process of fabricating and placing the IC connections 356, power connections 329, ground connections 331, and/or external connections 364. It is also noted that a length of any of substrate connections 344 may be greater than a length of one of power connections 329, one of ground connections, and/or one of IC connections 356.

Memory chip 112a may also include external connection pads 362, which may be stitch pads or ball bond pads. External connection pads 362 may be coupled to multiple external IO substrate pads 320 via external connections 364, which may be conductors. External connection 364a or 364b may follow an external protocol, such as a joint test action group (JTAG) protocol, to communicate configuration data. For example, multiple external IO substrate pads 320 may be coupled to a host, such as a computer, described below.

A first power source (not shown) may be coupled to IC chip power pad 346b and IC chip ground pad 348b. Moreover, a second power source (not shown) may be coupled to IC chip power pad 346a and IC chip ground pad 348a. Power may be supplied from the first power source to a portion of memory chip 112a via IC chip power pad 346b, power connection 329b, and memory chip power pad 358. Moreover, power may be supplied from the second power source to the remaining portion of memory chip 112a via IC chip power pad 346a, power connection 329a, and memory chip power pad 358.

Furthermore, memory chip 112a may receive, serially, configuration data to store in the memory chip 112a for later use in configuring a portion of IC chip 304. The configuration data may be received from the host via external IO substrate pads 320, external connections 364, and external connection pads 362. For example, the memory chip 112a may serially receive configuration data used to configure at least a portion of IC chip 304 from the host via the IO substrate pad 320c, the external connection 364a, and the external connection pad 362a. The configuration data may be stored in memory chip 112a for non-volatile storage, ready to configure IC chip 304 when needed. In various other embodiments, memory chip 112a may receive and store any type of data using these same connections.

Furthermore, the memory chip 112a may send, in parallel or serially, the configuration data to configure at least a portion of the IC chip 304, using IO memory pads 350, IC connections 356, and the IO IC pads 330. The parallel configuration of at least a portion of IC chip 304 may result in faster configuration than the serial configuration. Likewise, in various other embodiments, memory chip 112a may send, in parallel or serially, any type of data using these same connections.

A control block (not shown) of IC chip 304 may provide address and control signals via IO IC pads 330, IC connections 356, and IO memory pads 350 to memory chip 112a to access data from the memory chip 112a. The data may be accessed via IO IC pads 330, IC connections 356, and memory pads 350.

In one embodiment, IC chip power pad 346a and IC chip ground pad 348a may be located in a column other than third column 342 and IC chip power pad 346b and IC chip ground pad 348b may be located in a row other than third row 336.

In various embodiments, stack 302 may include any number of IO substrate pads 320, IO IC pads 330, IO memory pads 350, power pads 346, power pads 358, external connection pads 362, ground pads 348, and ground pads 360.

In some embodiments, memory chip power pad 358b and memory chip ground pad 360b may be located in memory chip first row 352 and/or memory chip power pad 358a and memory chip ground pad 360a may be located in memory chip first column 354.

In one embodiment, one or more IC connections 356 may be different in length than the remaining of the IC connections 356. In some embodiments, a length of any of power connections 329 may be different than a length of remaining power connections 329. Moreover, in one embodiment, a length of any of ground connections 331 may be different than a length of remaining ground connections 331. It is further noted that in various embodiments, a length of one of power connections 329 and/or one of ground connections 331 may be different than a length of one of IC connections 356.

In some embodiments, one IC connection 356a may be unstacked with respect to another IC connection 356b so that a top view of both the IC connections 356 shows the IC connections 356 as not crossing each other. In one embodiment, IC connection 356a may be unstacked with respect to power connection 329a so that a top view of the IC connection 356a and power connection 329a shows the IC connection 356a as not crossing the power connection 329a. In various embodiments, IC connection 356a may be unstacked above ground connection 331a so that a top view of the IC connection 356a and ground connection 331a shows the IC connection 356a as not crossing the ground connection 331a.

In some embodiments, power connection 329a may be unstacked above ground connection 331a so that a top view of the power connection 329a and ground connection 331a shows the power connection 329a as not crossing the ground connection 331a. Moreover, in various embodiments, power connection 329a may be unstacked above another power connection 329b so that a top view of the power connection 329a shows the power connection 329a as not crossing the other power connection 329b.

In some embodiments, power may be supplied to memory chip 112a via any number of power sources, any number of power connections 329, any number of memory chip power pads 358, and any number of IC chip power pads 346.

Figure 4:
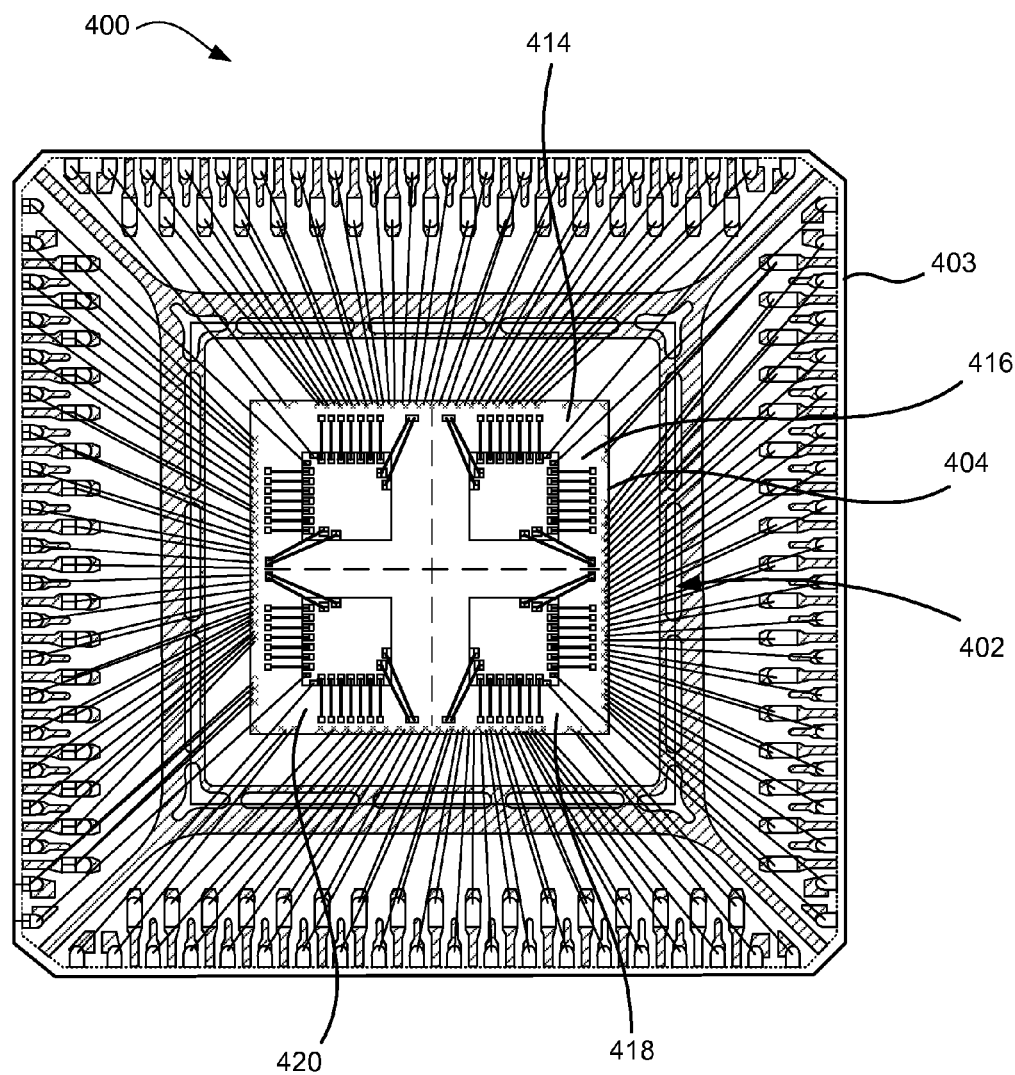
FIG. 4 is a top view of an exemplary package including a stack, in accordance with another embodiment of the present invention.

With reference to FIG. 4, a package 400 may include a stack 402 and a substrate 403. The stack 402 may include an IC chip 404 and memory chips 112. IC chip 404 may be an example of first IC chip member 102, second IC chip member 104, third IC chip member 106, fourth IC chip member 108, or fifth IC chip member 110. Memory chips 112 may be stacked above a front side 414 of IC chip 404. For example, memory chips 112 may be stacked above IC chip 404 so that a top view of stack 402 shows the memory chip 112b located in a top right quadrant 416 of IC chip 404, the memory chip 112c located in a bottom right quadrant 418 of IC chip 404, and the memory chip 112d located in a bottom left quadrant 420 of IC chip 404.

For families larger than the first family, different sizes of memory chips may be used to configure IC chip members of the larger families. The sizes of memory chips may be determined based on a desired memory yield, a desired configuration time, and/or a desired cost, such as manufacturing or assembly cost.

Figure 5:
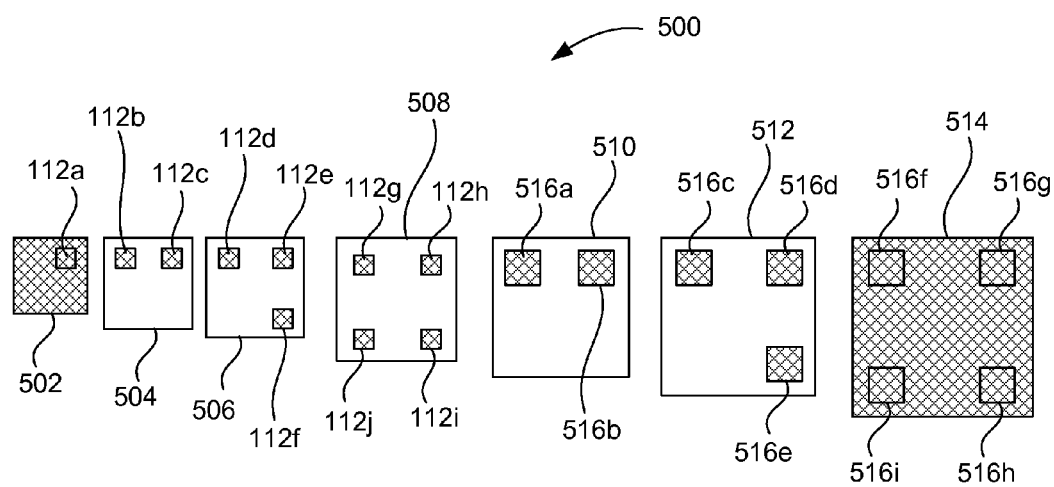
FIG. 5 is a top view of exemplary memory chips of multiple sizes stacked above IC chip members of a second family, in accordance with one embodiment of the present invention.

Referring to FIG. 5, multiple stacks 500 may include memory chips 112 and 516 of multiple sizes stacked above IC chip members 502, 504, 506, 508, 510, 512, and 514 of the second family. It is noted that IC chip 404 may be an example of IC chip member 502, 504, 506, 508, 510, 512, or 514. Any of memory chips 516 may be a non-volatile memory.

Any of memory chips 112 may have sufficient memory space to store data for IC chip member 502 but may not have sufficient memory space to store sufficient data for IC chip member 504. For the PLD example, memory chip 112a, b, c, d, e, f, g, h, I, or j can store at most an amount of configuration data to configure 10 k LEs of IC chip member 502 when IC chip member 504 includes 15 k LEs. IC chip member 504 may have a higher number of LEs than IC chip member 502, IC chip member 506 may have a higher number of LEs than IC chip member 504, IC chip member 508 may have a higher number of LEs than IC chip member 506, IC chip member 510 may have a higher number of LEs than IC chip member 508, IC chip member 512 may have a higher number of LEs than IC chip member 510, and IC chip member 514 may have a higher number of LEs than IC chip member 512.

When a number of memory chips 112 may not be sufficient to configure IC chip member 510, one or more memory chips 516 may be stacked above the IC chip member 510. For example, 45 k LEs of the IC chip member 510 cannot be configured with four memory chips 112 with one of the memory chips 112 having memory space used to configure at most 10 k LEs.

The number of memory chips 516 stacked above IC chip member 510 may be determined by the processing unit based on the largest IC chip member 514 of the second family and a number of memory chips 516 used to configure the largest IC chip member 514. For example, when the largest IC chip member 514 has 90 k LEs, one of memory chips 516 has memory space to configure 48 k LEs, and IC chip member 510 has 22 k LEs, it may be determined that two memory chips may be stacked above IC chip member 510. The largest IC chip member 514 may have a number of LEs higher than a number of LEs of any of the remaining IC chip members 502, 504, 506, 508, 510, and 512 of the second family.

In various embodiments, the second family may include any number of IC chip members. For example, the second family may have a larger number of IC chip members than the first family. In some embodiments, any of memory chips 516 may exclude a volatile memory.

Figure 6:
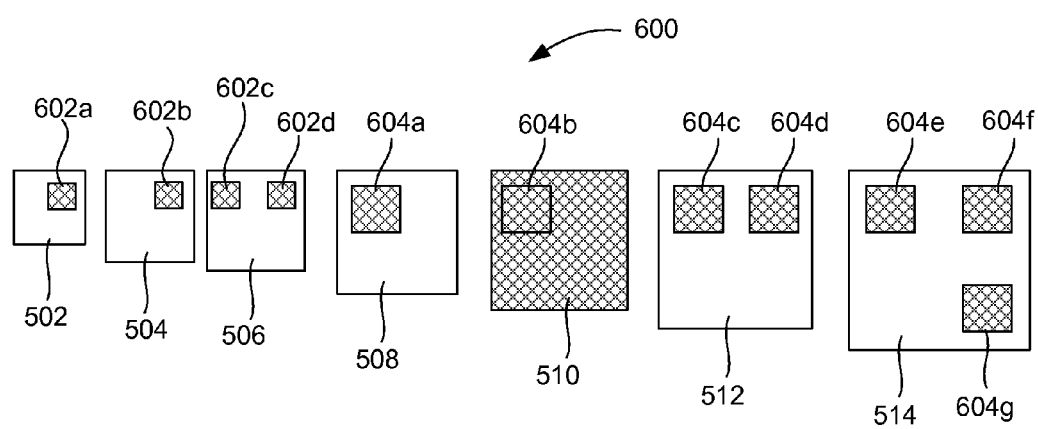
FIG. 6 is a top view of exemplary memory chips of multiple sizes stacked above the IC chip members of the second family, in accordance with one embodiment of the present invention.

Referring to FIG. 6, stacks 600 may include memory chips 602 and 604 of multiple sizes stacked above the IC chip members 502, 504, 506, 508, 510, 512, and 514. Any of memory chips 602 may be a non-volatile memory. Similarly, any of memory chips 604 may be a non-volatile memory. A size of any of memory chips 602 may be determined with respect to an IC chip member other than the smallest IC chip member 502 of the second family. For example, memory chip 602a may store configuration data used to configure a number of LEs of IC chip member 504. The smallest IC chip member 502 has a number of LEs lower than that of any the remaining IC chip members 504, 506, 508, 510, 512, and 514 of the second family.

A determination by the processing unit to select any of memory chips 602 to configure IC chip member 504, 506, or 508 of the second family may be made to provide a lower assembly and manufacturing cost than that associated with stacking memory chips 112 above the other IC chip member 504, 506, or 508. For example, memory chip 602b may be stacked above IC chip member 504 in a lesser number of placements than stacking multiple memory chips 112 above the IC chip member 504. On the other hand, the stacking of multiple memory chips 112 above IC chip member 504 may result in a higher memory yield and faster configuration time than stacking memory chip 602 above IC chip member 504. Any of memory chips 112 may have a lower number of components than any of memory chips 602. The lower number of components may create a lower chance of manufacturing defects and/or assembly defects than that created by a number of components in any of memory chips 602. Moreover, it may take a lesser amount of time to simultaneously transfer configuration data to IC chip member 504 from two memory chips 112 than to transfer the configuration data from memory chip 602b to the IC chip member 504. Also, a control block (not shown) of IC chip member 504 that receives configuration data from memory chip 602b may have a simpler design than a control block (not shown) of the IC chip member 504 that receives configuration data from multiple memory chips 112.

Any of memory chips 602 may have sufficient memory space to configure LEs of IC chip member 502 or of IC chip member 504. Furthermore, a number of memory chips 602 may have sufficient memory space to configure IC chip member 508. However, the memory chip 604a is stacked above IC chip member 508 instead of stacking multiple memory chips 602 above the IC chip member 508 to achieve a lower assembly and/or manufacturing cost.

It is noted that a size of any of memory chips 604 may be determined based on a number of LEs within IC chip member 510, or may be based on another criteria for memory requirements. For example, the memory chip 604b may have memory space used to configure a number of LEs of IC chip member 510. Also, it is noted that the memory chip 604a may have sufficient memory space to configure the IC chip member 508. Moreover, in some embodiments, a number of memory chips 604 sufficient to configure the largest IC chip member 514 may be less than four.

It is further noted that a memory yield of any of memory chips 516 may be greater than a memory yield of any of memory chips 604 and a configuration time taken to transfer configuration data to IC chip member 510 simultaneously from multiple memory chips 516 may be less than a configuration time taken to configure the IC chip member 510 with configuration data stored in the memory chip 604b.

Moreover, it is noted that there is a lower cost, such as assembly or manufacturing cost, of stacking the memory chips 516 above IC chip members 510, 512, and 514 than that associated with stacking memory chips 604 above the IC chip members 510, 512, and 514. For example, there is a higher cost associated with a larger number of placements of memory chips 516 above IC chip member 512 than that associated with number of placements of memory chips 604 above the IC chip member 512. Also, a control block, (not shown) of IC chip member 510 that receives configuration data from memory chip 604b may have a simpler design than a control block (not shown) of the IC chip member 510 that receives configuration data from multiple memory chips 516.

In various embodiments, the IC chip members 502, 504, 506, 508, 510, 512, and 514 are the only members of the second family. In some embodiments, each memory chip 602 and 604 may exclude a volatile memory.

Figure 7:
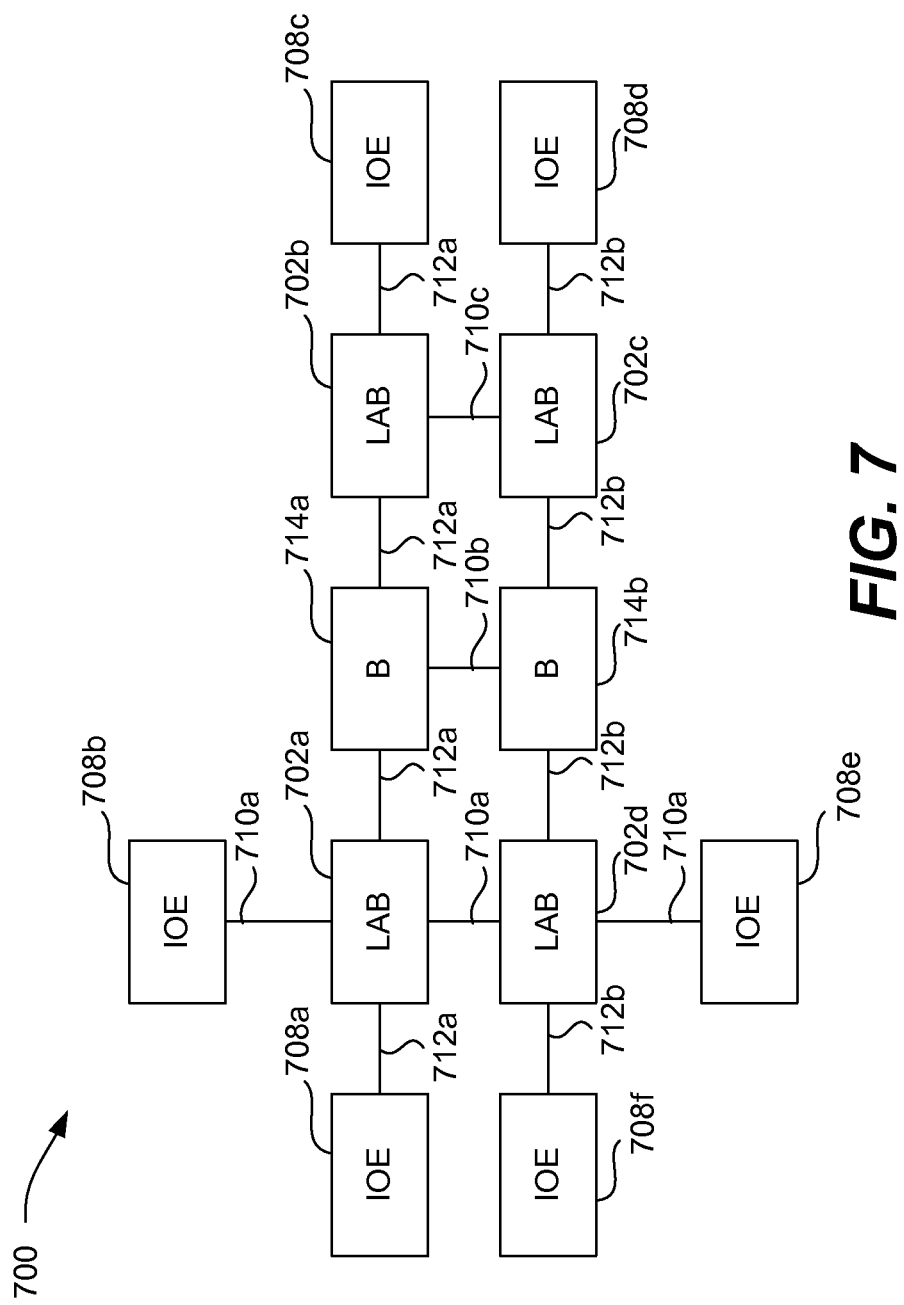
FIG. 7 shows an exemplary programmable logic device (PLD), in accordance with one embodiment of the present invention.

A PLD 700, which is one example of IC chip member 102, 104, 106, 108, 110, 502, 504, 506, 508, 510, 512, or 514, is described with reference to FIG. 7. PLD 700 may include a two-dimensional array of programmable logic array blocks (LABs) 702 that may be interconnected by a network of multiple column interconnects 710 and multiple row interconnects 712 of varying length and speed. For example, PLD 700 may be a field programmable gate array (FPGA). Any of the LABs 702, e.g., LAB 702c, can perform one or more functions, such as, digital signal processing (DSP), addition, multiplication, subtraction, etc. The network of column interconnects 710 and row interconnects 712 may include multiple switching circuits (not shown) that can be configured. LABs 702 may include multiple logic elements (LEs) (not shown) and each LE may include one or more registers (not shown). The LEs of one LAB 702a may be coupled to LEs of another LAB 702b via one or more switching circuits (not shown). A set of IO elements 708 may be located around the periphery of PLD 700 to support numerous single-ended and differential IO standards. In various embodiments, IO pads 315 are examples of I/O elements 708.

PLD 700 may further include a set of buffers (Bs) 714 that couple to LABs 702. The buffers 714 may be used to store data that is transferred between LABs 702. PLD 700 may function synchronous or asynchronous with one or more clock signals received via a clock tree (not shown). The clock tree may be overlaid on the PLD 700.

Figure 8:
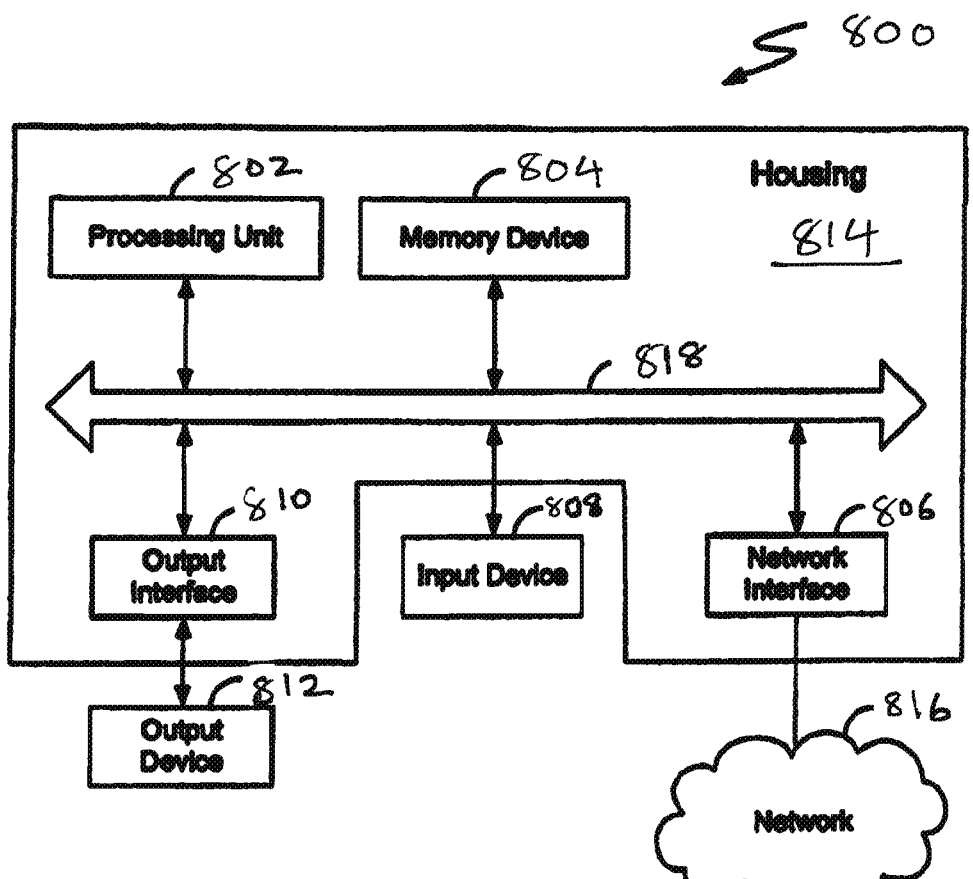
FIG. 8 shows an exemplary system for designing and configuring a PLD, in accordance with one embodiment of the present invention.

The PLD 700 may be configured using a computer system. Referring to FIG. 8, a computer system 800 may include a processing unit 802, a memory device 804, a network interface 806, an input device 808, an output interface 810, and an output device 812. Network interface 806, output interface 810, memory device 804, and processing unit 802 may be located within a housing 814 of the computer system 800.

Processing unit 802 may be a central processing unit (CPU), a microprocessor, a floating point coprocessor, a graphics coprocessor, a hardware controller, a microcontroller, a programmable logic device programmed for use as a controller, a network controller, or other processing unit. Memory device 804 may be a random access memory (RAM), a read-only memory (ROM), or a combination of RAM and ROM. For example, memory device 804 may include a non-transitory computer-readable medium, such as a floppy disk, a ZIP™ disk, a magnetic disk, a hard disk, a compact disc-ROM (CD-ROM), a recordable CD, a digital video disc (DVD), or a flash memory. Memory device 804 may store a program code for execution by the processing unit 802. For example, memory device 804 may store a program code for creating a design of PLD 700 and configuring the PLD 700.

Network interface 806 may be a modem or a network interface card (NIC) that allows processing unit 802 to communicate with a network 816, such as a wide area network (WAN) or a local area network (LAN). Processing unit 802 may be coupled via a wireless connection or a wired connection to network 816. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 108 include a mouse, a display device, a keyboard, a stylus, a microphone, a keypad, etc.

Output device 812 may be a liquid crystal display (LCD) device, a plasma display device, a light emitting diode (LED)

display device, or a cathode ray tube (CRT) display device. Examples of output interface 810 include a video controller that drives output device 812 to display one or more images based on instructions received from processing unit 802. In various embodiments, input device 808 and output device 812 may be integrated within the same device, such as a display device having a touch screen. Processing unit 102 may access the program code stored on memory device 804 or stored on a remote memory device (not shown), similar to memory device 804, via network 816. The processor unit 102 may execute the program code stored therein in order to implement the methods in accordance with various embodiments of the present invention. Processing unit 802, memory device 804, network interface 806, input device 808, output interface 810, and output device 812 may communicate with each other via a bus 818.

In various embodiments, system 800 may exclude input device 808 and/or network interface 806. In some embodiments, network interface 806, output interface 810, memory device 804, and processing unit 802 may be located outside the structure of housing 814.

In some embodiments, multiple memory devices may be used instead of memory device 804. Moreover, in one embodiment, multiple processing units may be used instead of processing unit 802.

It is appreciated that although the systems and methods of various embodiments of the present invention may be described in the context of PLDs, it should be recognized that various systems and methods can apply to system on programmable chips (SOPCs), complex PLDs (CPLDs), and other integrated circuit devices.

Although the foregoing systems and methods have been described in detail by way of illustration and example for purposes of clarity and understanding, it will be recognized that the above described systems and methods may be embodied in numerous other variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. A semiconductor device system, comprising:
   one or more integrated circuit chips having a process node in common and comprising a plurality of functional blocks or processing units, each of said integrated circuit chips having a top surface, and wherein each top surface includes four quadrants; and
   a plurality of like non-volatile memory dies mechanically and electrically attached to the top surface of at least one of the one or more integrated circuit chips, wherein each of the plurality of like non-volatile memory dies is positioned over a single quadrant of the four quadrants of the top surface of the one or more integrated circuit chips, wherein the plurality of like non-volatile memory dies includes a first memory die and a second memory die, wherein the first memory die is for providing configuration data for a first portion of one of the integrated circuit chips, and wherein the second memory die is for providing configuration data for a second portion of the integrated circuit chip.

2. The semiconductor device system of claim 1, wherein the one or more integrated circuit chips have different memory requirements.

3. The semiconductor device system of claim 1, wherein the plurality of like non-volatile memory dies have a same memory capacity, said memory capacity determined based at least in part on an amount of memory required by at least one of the one or more integrated circuit chips having a process node in common.

4. The semiconductor device system of claim 1, wherein each of the one or more integrated circuit chips is configured for attachment to at least one memory die having the same memory capacity and physical dimensions as said like non-volatile memory dies.

5. The semiconductor device system of claim 1, wherein the at least one integrated circuit chip attached to the plurality of like non-volatile memory dies is configured to receive parallel transmission of data from said plurality of like non-volatile memory dies.

6. The semiconductor device system of claim 1, wherein a first integrated circuit chip of the at least one attached integrated circuit chip comprises a first plurality of input/output (IO) integrated circuit pads, wherein the IO integrated circuit pads are coupled to a IO memory pads of a first memory die of the plurality of like non-volatile memory dies, via a first connection and a second connection, wherein the first and second connections are configurable to communicate data in parallel between the first memory die and the first integrated circuit chip.

7. The semiconductor device system of claim 1, wherein the one or more integrated circuit chips comprise programmable logic devices (PLDs) or field programmable gate arrays (FPGAs).

8. The semiconductor device system of claim 1, wherein the functional blocks or processing units comprise logic elements (LEs).

9. The semiconductor device system of claim 1, wherein the first memory die is positioned over a first quadrant of the integrated circuit chip and the second memory die is positioned over a second quadrant of the integrated circuit chip.

10. A semiconductor device product family, comprising:
    a plurality of integrated circuit chips, each of the integrated circuit chips having a process node in common, each of the integrated circuit chips having a top surface configured for mechanical and electrical attachment of one or more of a like non-volatile memory die, at least one of the integrated circuit chips having a surface configured for mechanical and electrical attachment of a plurality of the like non-volatile memory die, wherein each top surface includes four quadrants, wherein each of the one or more like non-volatile memory dies is individually positioned over a single quadrant of the four quadrants of the top surface of the one or more integrated circuit chips, wherein the like non-volatile memory dies includes a first memory die and a second memory die, wherein the first memory die is for providing configuration data for a first portion of one of the integrated circuit chips, and wherein the second memory die is for providing configuration data for a second portion of the integrated circuit chip.

11. The semiconductor device product family of claim 10, further comprising one or more attached like non-volatile memory dies.

12. The semiconductor device product family of claim 11, wherein the like non-volatile memory dies have a same memory capacity, said memory capacity determined based at least in part on an amount of memory required by at least one of the integrated circuit chips having a process node in common.

13. The semiconductor device product family of claim 10, wherein the plurality of integrated circuit chips are each configured to receive parallel transmission of data from a plurality of like non-volatile memory dies.

14. The semiconductor device product family of claim 10, wherein a first integrated circuit chip of the plurality of integrated circuit chips comprises a first plurality of input/output (IO) integrated circuit pads, wherein the IO integrated circuit pads are coupled to a IO memory pads of a first memory die of the plurality of like non-volatile memory dies, via a first connection and a second connection, wherein the first and second connections are configurable to communicate data in parallel between the first memory die and the first integrated circuit chip.

15. The semiconductor device product family of claim 10, wherein the plurality of integrated circuit chips comprise programmable logic devices (PLDs) or field programmable gate arrays (FPGAs).

16. The semiconductor device product family of claim 10, wherein the first memory die is positioned over a first quadrant of the integrated circuit chip and the second memory die is positioned over a second quadrant of the integrated circuit chip.

17. A semiconductor device product family, comprising:
a plurality of integrated circuit chips each of the chips having a process node in common, and sub-pluralities of said plurality of integrated circuit chips, wherein each of the integrated circuit chips of one of said sub-pluralities has a top surface configured for mechanical and electrical attachment of one or more of like non-volatile memory die, and at least one of the integrated circuit chips having a surface configured for mechanical and electrical attachment of a plurality of the like non-volatile memory die, wherein each top surface includes four quadrants, wherein each of the one or more like non-volatile memory dies is individually positioned over a single quadrant of the four quadrants of the top surface of the one or more integrated circuit chips, wherein the like non-volatile memory dies includes a first memory die and a second memory die, wherein the first memory die is for providing configuration data for a first portion of one of the integrated circuit chips, and wherein the second memory die is for providing configuration data for a second portion of the integrated circuit chip.

18. The semiconductor device product family of claim 17, wherein the first memory die is positioned over a first quadrant of the integrated circuit chip and the second memory die is positioned over a second quadrant of the integrated circuit chip.

19. A method, comprising:
receiving an indication of an amount of memory required by one or more integrated circuit chip members of a product family, the product family having a plurality of integrated circuit chip members, wherein each of said integrated circuit chips has a surface configured for mechanical and electrical attachment of one or more of a like non-volatile memory die, wherein each top surface includes four quadrants;
determining an amount of memory to include in the like non-volatile memory die, the determination based at least in part on a memory requirement of one or more members of the product family;
wherein at least one of the integrated circuit chips has a surface configured for mechanical and electrical attachment of a plurality of the like non-volatile memory die, wherein each of the plurality of the like non-volatile memory die is configured for individually positioning over a single quadrant of the four quadrants of the top surface of the one or more integrated circuit chips, wherein the like non-volatile memory dies includes a first memory die and a second memory die, wherein the first memory die is for providing configuration data for a first portion of one of the integrated circuit chips, and wherein the second memory die is for providing configuration data for a second portion of the integrated circuit chip.

20. The method of claim 19, wherein the determining is performed at a design stage, and the one or more members of the product family are configured to optimize the attachment of the non-volatile memory die.

21. The method of claim 19, wherein the determining is performed at a design stage, and the one or more members of the product family are configured to optimize transfer of data to and from the non-volatile memory die.

22. The method of claim 19, wherein the determining is performed at a manufacturing stage with some known configuration of nonvolatile memory dies and IC chips.

23. The method of claim 19, wherein the determining the amount of memory space to include in the non-volatile memory die is based at least in part on the indication of the amount of memory required by the one or more members of the product family.

24. The method of claim 19, wherein the one or more members of a product family of integrated circuit chips are configured for attachment to the non-volatile memory die.

25. The method of claim 19, wherein the first memory die is positioned over a first quadrant of the integrated circuit chip and the second memory die is positioned over a second quadrant of the integrated circuit chip.

26. A system, comprising:
a first integrated circuit chip characterized by a first process node;
a second integrated circuit chip characterized by the first process node;
a first non-volatile memory die having a capacity and physical size attached to the first integrated circuit chip, and wherein the first non-volatile memory die is positioned over a first quadrant of the first integrated circuit chip; and
a second and third non-volatile memory die each having the same capacity and physical size as the first non-volatile memory die, the second and third non-volatile memory die attached to the second integrated circuit chip, and wherein the second non-volatile memory die is positioned over a first quadrant of the second integrated circuit chip, and the third non-volatile memory die is positioned over a second quadrant of the second integrated circuit chip, wherein the second non-volatile memory die is for providing configuration data for a first portion of the second integrated circuit chip, and wherein the third non-volatile memory die is for providing configuration data for a second portion of the second integrated circuit chip.

27. The system of claim 26, wherein the first and second integrated circuit chips have different memory requirements.

28. The system of claim 26, wherein the first, second and third memory die have a same memory capacity, said memory capacity determined based at least in part on an amount of memory required by the first or second integrated circuit chips.

29. The system of claim 26, wherein the first or second integrated circuit chip is configured to receive parallel transmission of data from a plurality of non-volatile memory dies.

30. The system of claim 26, wherein the first or second integrated circuit chip comprises a first plurality of input/output (IO) integrated circuit pads, wherein the IO integrated circuit pads are coupled to a IO memory pads of a first memory die of the plurality of like non-volatile memory dies, via a first connection and a second connection, wherein the first and second connections are configurable to communicate data in parallel between the first memory die and the first or second integrated circuit chip.

31. The system of claim 26, wherein the first and second integrated circuit chips comprise programmable logic devices (PLDs) or field programmable gate arrays (FPGAs).

* * * * *